(12) United States Patent
Kawai et al.

(10) Patent No.: US 12,362,207 B2
(45) Date of Patent: Jul. 15, 2025

(54) EFEM

(71) Applicant: Sinfonia Technology Co., Ltd., Tokyo (JP)

(72) Inventors: Toshihiro Kawai, Tokyo (JP); Gengoro Ogura, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 18/649,968

(22) Filed: Apr. 29, 2024

(65) Prior Publication Data

US 2024/0282606 A1 Aug. 22, 2024

Related U.S. Application Data

(63) Continuation of application No. 17/959,247, filed on Oct. 3, 2022, now Pat. No. 12,002,693, which is a
(Continued)

(30) Foreign Application Priority Data

Mar. 15, 2018 (JP) .................................. 2018-048467

(51) Int. Cl.
| H01L 21/67 | (2006.01) |
| B01D 46/00 | (2022.01) |
| B01D 46/10 | (2006.01) |

(52) U.S. Cl.
CPC .... *H01L 21/67201* (2013.01); *B01D 46/0041* (2013.01); *H01L 21/67196* (2013.01); *B01D 46/10* (2013.01); *B01D 2273/30* (2013.01)

(58) Field of Classification Search
CPC ........ H01L 21/67201; H01L 21/67196; B01D 46/0041; B01D 46/10; B01D 2273/30
See application file for complete search history.

(56) References Cited

U.S. PATENT DOCUMENTS 5,326,316 A 7/1994 Hashimoto et al.
5,565,034 A 10/1996 Nanbu et al.
(Continued)

FOREIGN PATENT DOCUMENTS

JP 10172978 A 6/1998
JP 2002246441 A 8/2002
(Continued)

OTHER PUBLICATIONS

U.S. Appl. No. 16/980,727, Non-Final Office Action, Feb. 3, 2022, 13 pages.
(Continued)

*Primary Examiner* — Glenn F Myers
(74) *Attorney, Agent, or Firm* — Kilpatrick Townsend & Stockton LLP

(57) ABSTRACT

Particles in an accommodation chamber are also easily discharged while facilitating replacement of an atmosphere in the accommodation chamber with an inert gas. An EFEM includes a load port 4, a housing configured to define, in the housing, a transfer chamber closed by connecting the load port 4 to an opening provided in a partition wall, a supply pipe for supplying nitrogen to a transfer chamber, and a discharge pipe 49 for discharging a gas in the transfer chamber. The load port 4 includes an opening/closing mechanism 54 capable of opening and closing a lid 101 of a mounted FOUP 100, and an accommodation chamber 60 kept in communication with the transfer chamber via a slit 51*b* and configured to accommodate a part of the opening/closing mechanism 54. The discharge pipe 49 is connected to the accommodation chamber 60 to discharge the gas in the transfer chamber via the accommodation chamber 60.

12 Claims, 8 Drawing Sheets

Related U.S. Application Data continuation of application No. 16/980,727, filed as application No. PCT/JP2019/010349 on Mar. 13, 2019, now Pat. No. 11,495,481.

(56) References Cited

U.S. PATENT DOCUMENTS

| | | | |
|---|---|---|---|
| 9,272,315 B2 * | 3/2016 | Chou | B01D 46/442 |
| 10,340,168 B2 | 7/2019 | Ochiai et al. | |
| 11,495,481 B2 | 11/2022 | Kawai et al. | |
| 2003/0031537 A1 | 2/2003 | Tokunaga | |
| 2006/0225299 A1 | 10/2006 | Kim et al. | |
| 2009/0175709 A1 | 7/2009 | Okabe et al. | |
| 2011/0070055 A1 | 3/2011 | Sasaki et al. | |
| 2015/0170945 A1 * | 6/2015 | Segawa | H01L 21/67115 |
| 2016/0260627 A1 | 9/2016 | Nakano | |
| 2017/0170033 A1 * | 6/2017 | Okabe | H01L 21/67017 |
| 2017/0170042 A1 | 6/2017 | Okabe et al. | |
| 2017/0178942 A1 | 6/2017 | Sakata et al. | |
| 2018/0040493 A1 | 2/2018 | Kawai et al. | |
| 2018/0161830 A1 * | 6/2018 | Sasaki | B08B 5/00 |
| 2018/0229945 A1 * | 8/2018 | Suzuki | H01L 21/67201 |
| 2019/0267258 A1 | 8/2019 | Rice | |
| 2020/0402819 A1 * | 12/2020 | Rice | H01L 21/67017 |

FOREIGN PATENT DOCUMENTS

| | | | |
|---|---|---|---|
| JP | 2003007799 A | * | 1/2003 |
| JP | 2011066260 A | | 3/2011 |
| JP | 2015146349 A | | 8/2015 |
| KR | 20170054427 A | | 5/2017 |
| KR | 20170121190 A | | 11/2017 |
| WO | 2017022432 A1 | | 2/2017 |

OTHER PUBLICATIONS

U.S. Appl. No. 16/980,727, Notice of Allowance, Jul. 5, 2022, 8 pages.
U.S. Appl. No. 16/980,727, Response to Non-Final Office Action, Apr. 29, 2022, 16 pages.
U.S. Appl. No. 17/959,247, Advisory Action, Dec. 22, 2023, 2 pages.
U.S. Appl. No. 17/959,247, Corrected Notice of Allowability, Apr. 2, 2024, 2 pages.
U.S. Appl. No. 17/959,247, Corrected Notice of Allowability, Mar. 15, 2024, 2 pages.
U.S. Appl. No. 17/959,247, Final Office Action, Aug. 31, 2023, 11 pages.
U.S. Appl. No. 17/959,247, Non-Final Office Action, Mar. 16, 2023, 8 pages.
U.S. Appl. No. 17/959,247, Notice of Allowance, Feb. 14, 2024, 8 pages.
Korean Patent Application No. 10-2020-7026433, Office Action, Nov. 15, 2023, 11 pages (5 pages of original document, 6 pages of English translation).
International Application No. PCT/JP2019/010349, International Search Report and Written Opinion, May 21, 2019, 12 pages.

* cited by examiner

FIG. 8
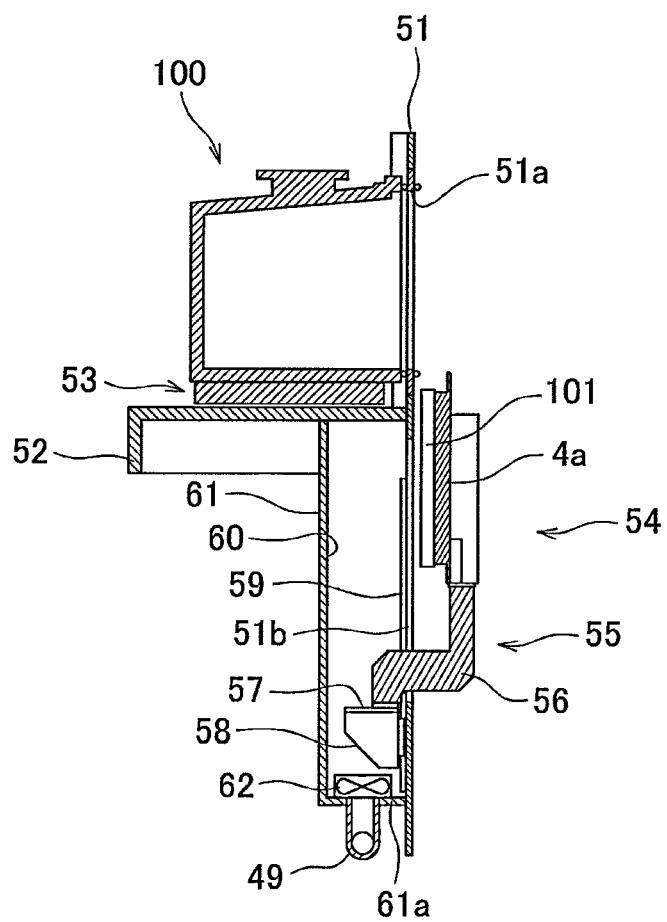
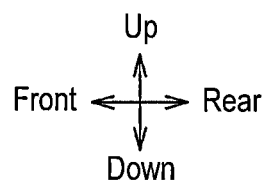

EFEM

CROSS-REFERENCE TO RELATED APPLICATIONS

This application is a continuation of U.S. patent application Ser. No. 17/959,247 filed Oct. 3, 2022, which is a continuation of U.S. patent application Ser. No. 16/980,727 filed Sep. 14, 2020 and now issued as U.S. Pat. No. 11,495,481, which application is the national phase entry under 35 USC § 371 of International Application PCT/JP2019/010349 filed Mar. 13, 2019, which application claims priority to and benefits of Japan Patent Application No. 2018-048467 filed Mar. 15, 2018, the entire contents of each of which are hereby incorporated by this reference.

TECHNICAL FIELD

The present disclosure relates to an EFEM (Equipment Front End Module) capable of supplying an inert gas to a closed transfer chamber and replacing an atmosphere in the closed transfer chamber with an inert gas atmosphere.

BACKGROUND

Patent Document 1 describes an EFEM that includes a load port on which a FOUP (Front-Opening Unified Pod) for accommodating wafers (semiconductor substrates) is mounted and a housing which is closed by connecting the load port to an opening provided on a front wall thereof and which forms a transfer chamber in which a wafer is transferred. The EFEM delivers a wafer between a processing apparatus that performs a predetermined process on the wafer and a FOUP.

Conventionally, the influence of oxygen, moisture, and the like in a transfer chamber on a semiconductor circuit manufactured on a wafer has been small. However, in recent years, such influence has become apparent as a semiconductor circuit is further miniaturized. Therefore, the EFEM described in Patent Document 1 is configured such that the transfer chamber is filled with nitrogen which is an inert gas. Specifically, the EFEM includes a circulation flow path configured to circulate nitrogen inside the housing and constituted of a transfer chamber and a gas return path, a gas supply unit for supplying nitrogen from an upper portion of the gas return path, and a gas discharge unit for discharging nitrogen from a lower portion of the gas return path. Nitrogen is appropriately supplied and discharged depending on the change in the oxygen concentration and the like in the circulation flow path. This makes it possible to maintain a nitrogen atmosphere in the transfer chamber.

PRIOR ART DOCUMENT

Patent Document

Patent Document 1: Japanese laid-open publication No. 2015-146349

The load port of the EFEM described in Patent Document 1 includes an opening/closing mechanism capable of opening/closing a lid of a mounted FOUP, and an accommodation chamber communicating with the transfer chamber and configured to accommodate a part of the opening/closing mechanism. However, the gas discharge unit is connected to the lower portion of the gas return path of the circulation flow path. Therefore, at the time of starting the EFEM (including the time after maintenance), even if the gas is discharged from the circulation flow path while supplying nitrogen to the circulation flow path, a problem occurs in that it takes time to replace the accommodation chamber with an nitrogen atmosphere because the accommodation chamber communicating with the transfer chamber is not included in the circulation flow path. Furthermore, a problem is posed in that particles in the accommodation chamber fly up due to the operation of the opening/closing mechanism and easily enter the transfer chamber.

The present disclosure provides some embodiments of an EFEM capable of discharging particles in an accommodation chamber while facilitating replacement of an atmosphere in the accommodation chamber with an inert gas.

SUMMARY

According to one embodiment of the present disclosure, there is provided an EFEM, including: a load port; a housing closed by connecting the load port to an opening provided on a side wall of the housing and configured to define, in the housing, a transfer chamber for transferring a substrate; a substrate transfer device disposed in the transfer chamber and configured to transfer the substrate; an inert gas supply unit configured to supply an inert gas to the transfer chamber; and a gas discharge unit configured to discharge a gas in the transfer chamber. The load port includes an opening/closing mechanism capable of opening and closing a lid of a mounted FOUP, and an accommodation chamber kept in communication with the transfer chamber and configured to accommodate a part of the opening/closing mechanism, and the gas discharge unit is connected to the accommodation chamber to discharge the gas in the transfer chamber via the accommodation chamber.

With this configuration, the gas discharge unit is connected to the accommodation chamber of the load port in which the opening/closing mechanism is accommodated. Therefore, the atmosphere in the accommodation chamber can be easily replaced with an inert gas atmosphere. For example, at the time of starting the EFEM (including the time after performing maintenance), the inert gas is supplied by the inert gas supply unit and the gas is discharged by the gas discharge unit. Therefore, the atmosphere in the transfer chamber and the accommodation chamber can be quickly replaced with the inert gas atmosphere. This makes it possible to shorten the time required to start the work such as the transfer of the substrate or the like. Furthermore, particles in the accommodation chamber can be discharged during gas discharge. Therefore, the particles in the accommodation chamber are less likely to fly up during the operation of the opening/closing mechanism and are less likely to enter into the transfer chamber.

In the present embodiment, the EFEM may preferably further include: a gas outlet provided in an upper portion of the transfer chamber and configured to provide the inert gas into the transfer chamber; a gas suction port provided in a lower portion of the transfer chamber and configured to suck the inert gas in the transfer chamber; a gas return path configured to return the inert gas sucked from the gas suction port to the gas outlet; and a filter configured to remove particles contained in the inert gas provided from the gas outlet. As a result, it is possible to circulate the inert gas via the gas return path while generating a downward flow of the inert gas from which particles have been removed in the transfer chamber. Therefore, it is possible to suppress the consumption of the inert gas and reduce the cost.

In the present embodiment, the accommodation chamber may preferably be provided with a fan configured to send the inert gas to the gas discharge unit. This makes it possible to suppress the flying-up of particles as compared with the case where the fan is provided in the transfer chamber.

In the present embodiment, the accommodation chamber may preferably be arranged below a mounting part on which the FOUP is mounted, and the gas discharge unit may preferably be connected to a bottom wall of the accommodation chamber. This makes it possible to effectively discharge particles.

In the present embodiment, the housing may preferably be provided with a plurality of the load ports, and the gas discharge unit may preferably be connected to the accommodation chamber of each of the load ports. This makes it possible to effectively discharge particles in the accommodation chamber of each of the load ports.

According to the EFEM of the present disclosure, the gas discharge unit is connected to the accommodation chamber of the load port in which the opening/closing mechanism is accommodated. Therefore, the atmosphere in the accommodation chamber can be easily replaced with the inert gas atmosphere. For example, at the time of starting the EFEM (including the time after performing maintenance), the inert gas is supplied by the inert gas supply unit and discharged by the gas discharge unit. Therefore, the atmosphere in the transfer chamber and the accommodation chamber can be quickly replaced with the inert gas atmosphere. This makes it possible to shorten the time required to start the work such as the transfer of the substrate or the like. Furthermore, particles in the accommodation chamber can be discharged during gas discharge. Therefore, the particles in the accommodation chamber are less likely to fly up during the operation of the opening/closing mechanism and are less likely to enter the transfer chamber.

BRIEF DESCRIPTION OF DRAWINGS

FIG. 8 is a side sectional view of the load port showing a state in which the door is opened.

DETAILED DESCRIPTION

Figure 1:
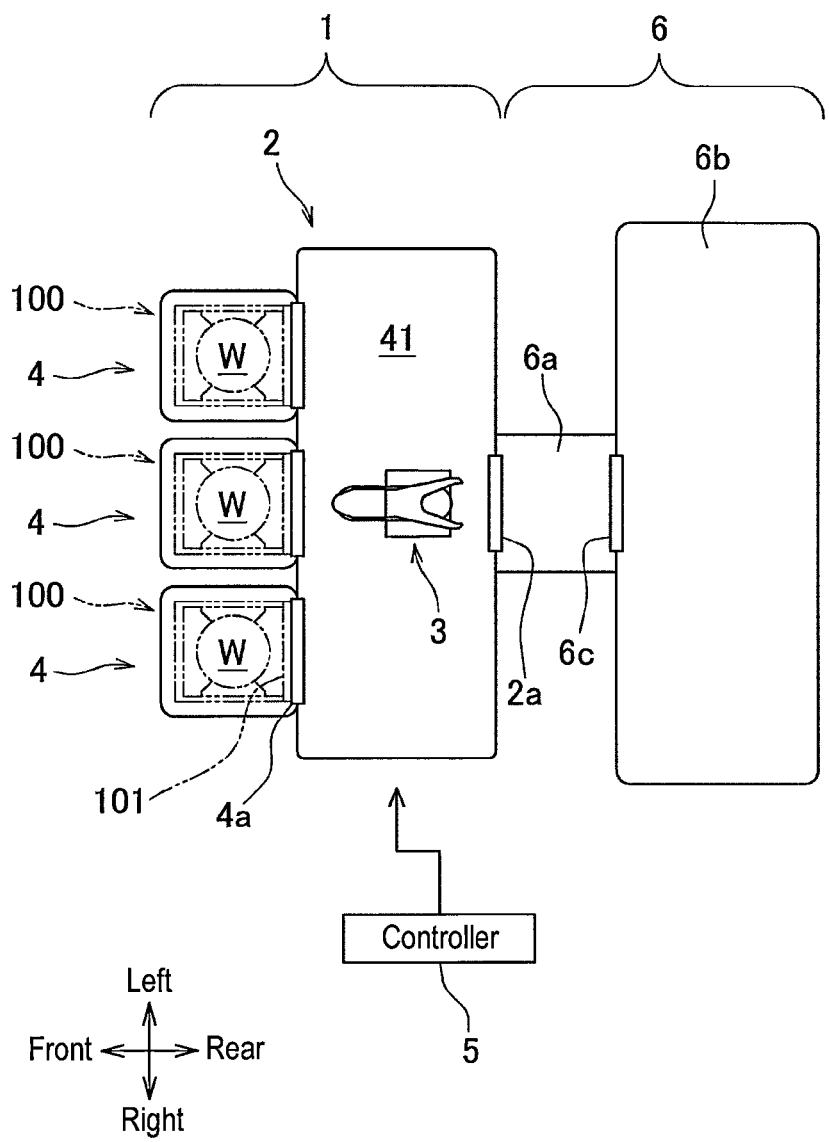
FIG. 1 is a plan view showing a schematic configuration of an EFEM according to an embodiment of the present disclosure and the surroundings thereof.

Hereinafter, an EFEM 1 according to an embodiment of the present disclosure will be described with reference to FIGS. 1 to 8. For the convenience of explanation, the directions shown in FIG. 1 are defined as front, rear, left, and right directions. That is, in the present embodiment, the direction in which an EFEM (Equipment Front End Module) 1 and a substrate processing apparatus 6 are arranged side by side is defined as a front-rear direction, the side of the EFEM 1 is defined as a front side, and the side of the substrate processing apparatus 6 is defined as a rear side. Furthermore, the direction in which a plurality of load ports 4 is arranged side by side and which is orthogonal to the front-rear direction, is defined as a left-right direction. In addition, the direction orthogonal to both the front-rear direction and the left-right direction is defined as an up-down direction.

(Schematic Configuration of EFEM and Surroundings Thereof)

Figure 2:
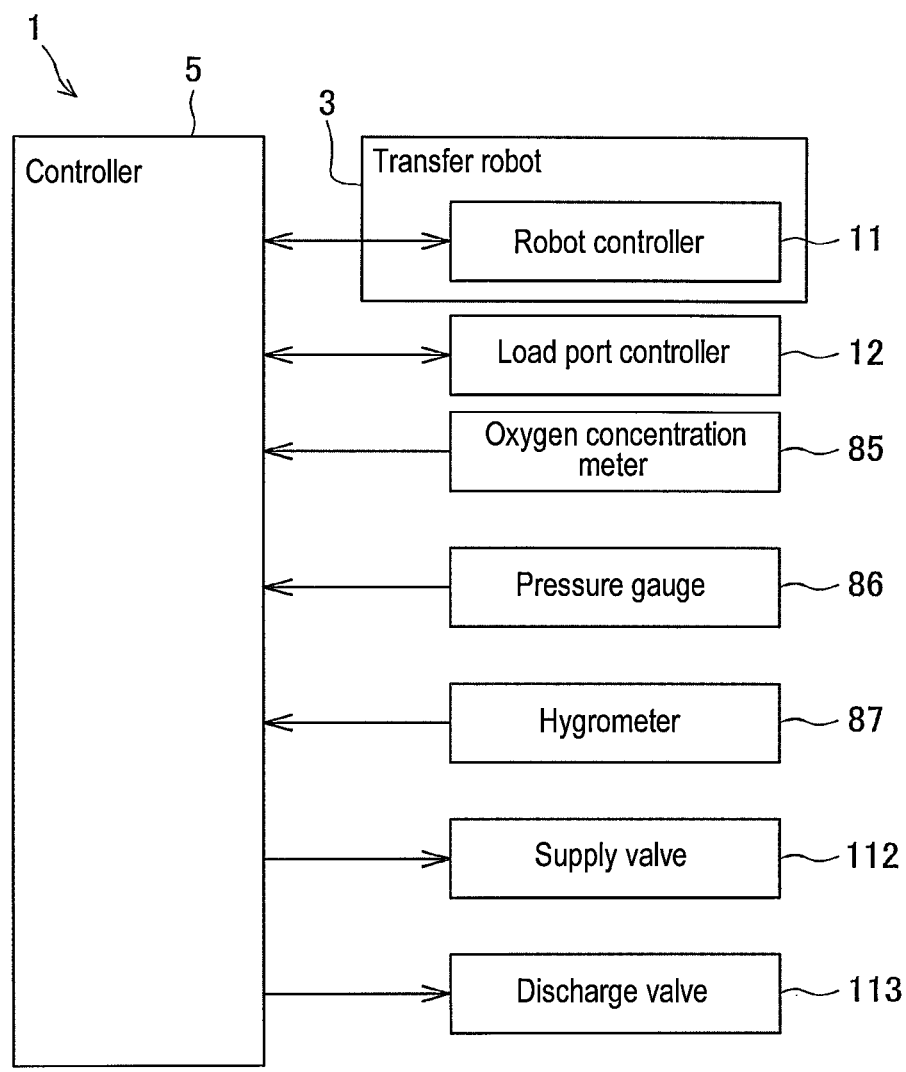
FIG. 2 is a diagram showing an electrical configuration of the EFEM shown in FIG. 1.

First, the schematic configuration of the EFEM 1 and surroundings thereof will be described with reference to FIGS. 1 and 2. FIG. 1 is a plan view showing the schematic configuration of the EFEM 1 according to the present embodiment and the surroundings thereof. FIG. 2 is a diagram showing the electrical configuration of the EFEM 1. As shown in FIG. 1, the EFEM 1 includes a housing 2, a transfer robot 3 (substrate transfer device), three load ports 4, and a controller 5. A substrate processing apparatus 6 that performs a predetermined process on a wafer W (substrate) is arranged behind the EFEM 1. The EFEM 1 delivers the wafer W between a FOUP (Front-Opening Unified Pod) 100 mounted on the load port 4 and the substrate processing apparatus 6 by using the transfer robot 3 arranged in the housing 2. The FOUP 100 is a container capable of accommodating a plurality of wafers W side by side in the up-down direction and includes an openable/closable lid 101 (lid portion) provided at the rear end portion thereof (the end portion on the side of the housing 2 in the front-rear direction). The FOUP 100 is transferred by, for example, a known OHT (overhead traveling automatic transfer vehicle) (not shown). The FOUP 100 is delivered between the OHT and the load port 4.

The housing 2 is used to connect the three load ports 4 and the substrate processing apparatus 6. Inside the housing 2, there is formed a transfer chamber 41 which is substantially sealed from the external space, and which transfers the wafer W without exposing it to the ambient air. When the EFEM 1 is operating, the transfer chamber 41 is filled with nitrogen. Although the transfer chamber 41 is filled with nitrogen in the present embodiment, it may be possible to use any inert gas other than nitrogen. The housing 2 is configured so that nitrogen circulates in the internal space including the transfer chamber 41 (details will be described later). Furthermore, an openable/closable door 2a is provided at the rear end of the housing 2. The transfer chamber 41 is connected to the substrate processing apparatus 6 with the door 2a interposed therebetween.

The transfer robot 3 is arranged in the transfer chamber 41 and configured to transfer the wafer W. The transfer robot 3 includes a base part 90 (see FIG. 3) whose position is fixed, an arm mechanism 70 (see FIG. 3) arranged above the base part 90 to hold and transfer the wafer W, and a robot controller 11 (see FIG. 2). The transfer robot 3 mainly performs an operation of taking out the wafer W from the FOUP 100 and delivering it to the substrate processing apparatus 6, and an operation of receiving the wafer W processed by the substrate processing apparatus 6 and returning it to the FOUP 100.

Figure 5:
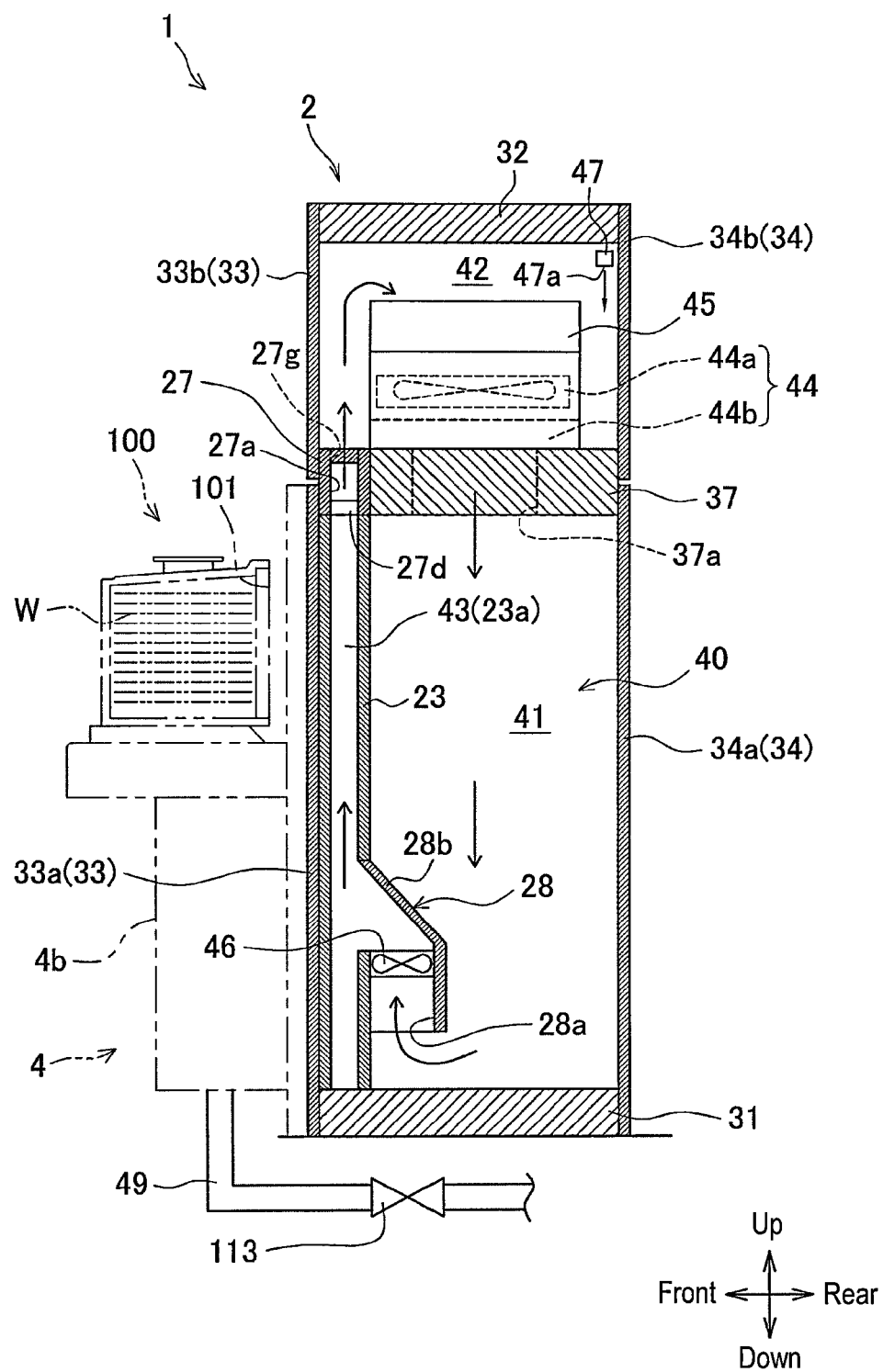
FIG. 5 is a sectional view taken along line V-V in FIG. 3
Figure 7:
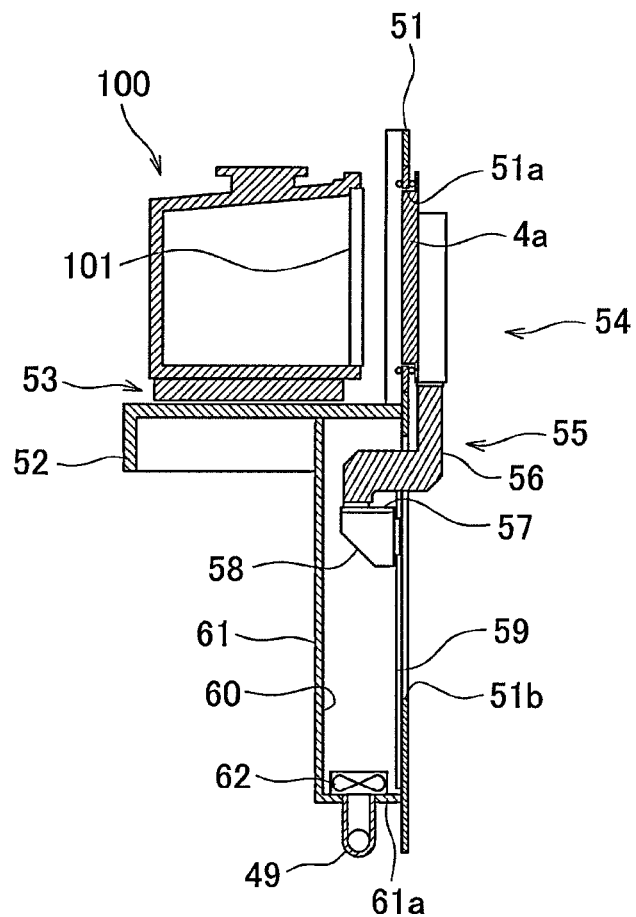
FIG. 7 is a side sectional view of a load port showing a state in which a door is closed.

The load ports 4 are used to mount the FOUP 100 (see FIG. 7). As shown in FIGS. 1 and 5, the load ports 4 are arranged side by side in the left-right direction along a partition wall 33 on the front side of the housing 2. Each load port 4 closes each of three openings (not shown), which are formed in the partition wall 33 of the housing 2, through the use of a base 51 (see FIG. 7) provided at the rear end thereof. The three openings are formed between four columns 21 to 24 in the left-right direction. Thus, the transfer chamber 41 is formed in the housing 2 as a substantially sealed space. Furthermore, the load port 4 is configured to be able to replace the atmosphere in the FOUP 100 with nitrogen. At the rear end of the load port 4, there is provided a door 4a, which is a part of an opening/closing mechanism 54 described later. The door 4a is opened and closed by a door driving mechanism 55 (a part of the opening/closing mechanism 54). The door 4a is configured to be able to unlock the lid 101 of the FOUP 100 and hold the lid 101. The door 4a is opened by the door driving mechanism 55 in a state in which the door 4a holds the unlocked lid 101, whereby the lid 101 is opened. Thus, the wafer W in the FOUP 100 can be taken out by the transfer robot 3. Furthermore, the transfer robot 3 can accommodate the wafer W in the FOUP 100.

As shown in FIG. 2, the controller 5 is electrically connected to the robot controller 11 of the transfer robot 3, the load port controller 12 of the load port 4, and the controller (not shown) of the substrate processing apparatus 6 and is configured to make communication with these controllers. Furthermore, the controller 5 is electrically connected to an oxygen concentration meter 85, a pressure gauge 86, a hygrometer 87, and the like, which are installed inside the housing 2. The controller 5 receives the measurement results of these measurement instruments and grasps information about the atmosphere inside the housing 2. Furthermore, the controller 5 is electrically connected to a supply valve 112 and a discharge valve 113 (described later). The controller 5 adjusts the opening degrees of these valves to appropriately adjust the nitrogen atmosphere in the housing 2.

As shown in FIG. 1, the substrate processing apparatus 6 includes, for example, a load lock chamber 6a and a processing chamber 6b. The load lock chamber 6a is a chamber connected to the transfer chamber 41 across the door 2a of the housing 2 and configured to temporarily hold the wafer W. The processing chamber 6b is connected to the load lock chamber 6a via a door 6c. In the processing chamber 6b, a predetermined process is performed on the wafer W by a processing mechanism (not shown).

(Housing and Internal Configuration Thereof)

Figure 3:
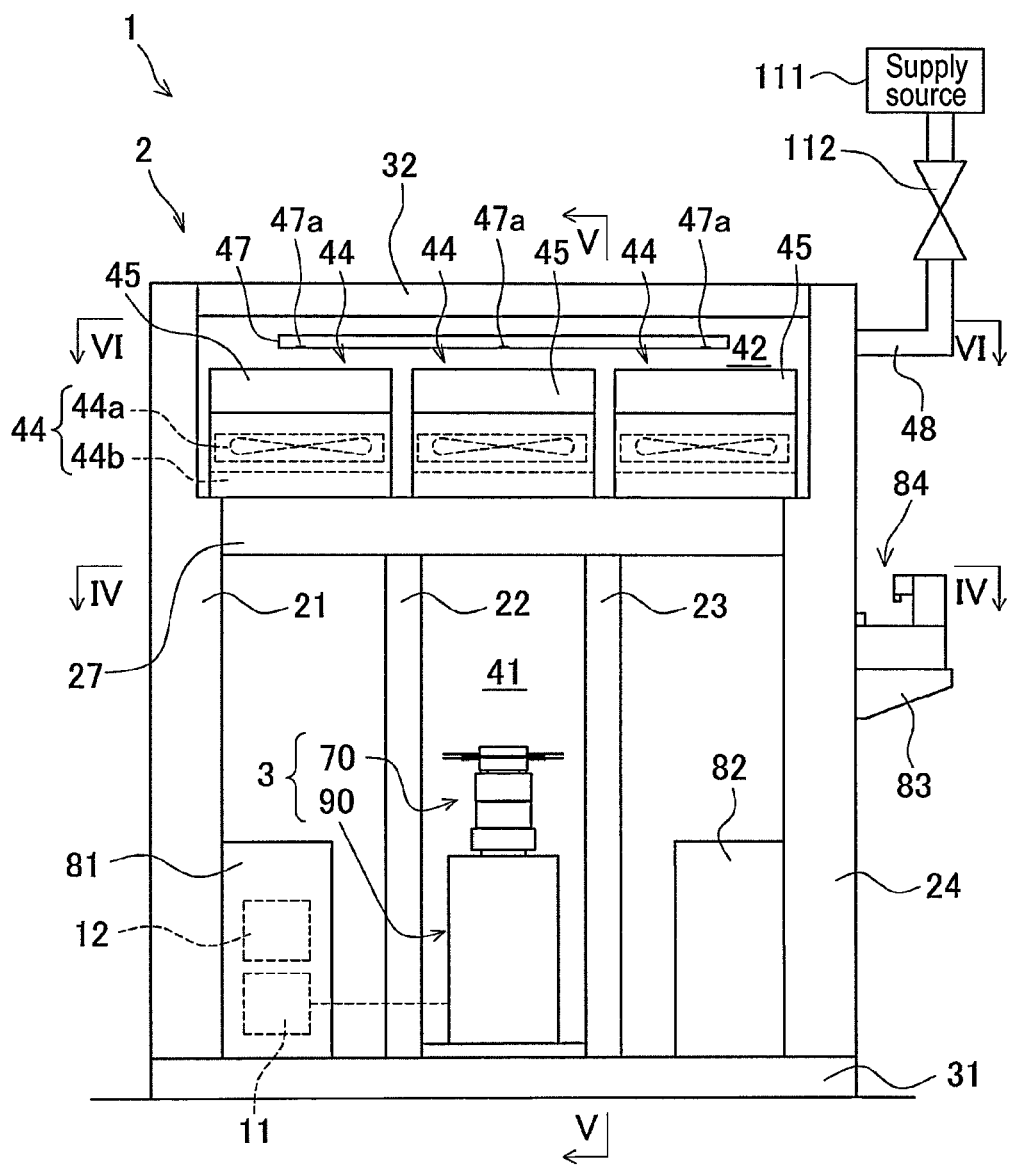
FIG. 3 is a front view of the housing shown in FIG. 1, which is viewed from the front side.
Figure 4:
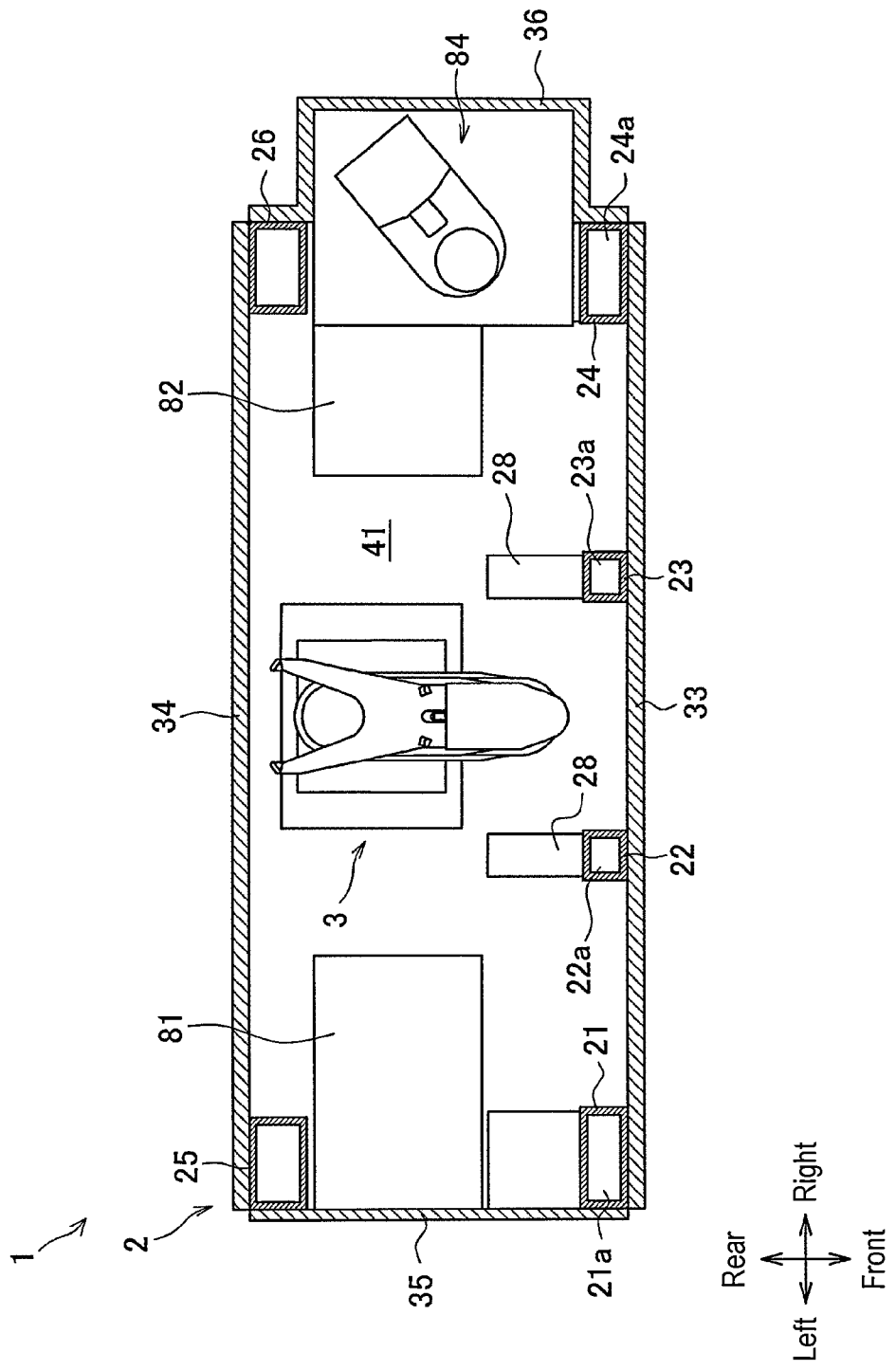
FIG. 4 is a sectional view taken along line IV-IV in FIG. 3.
Figure 6:
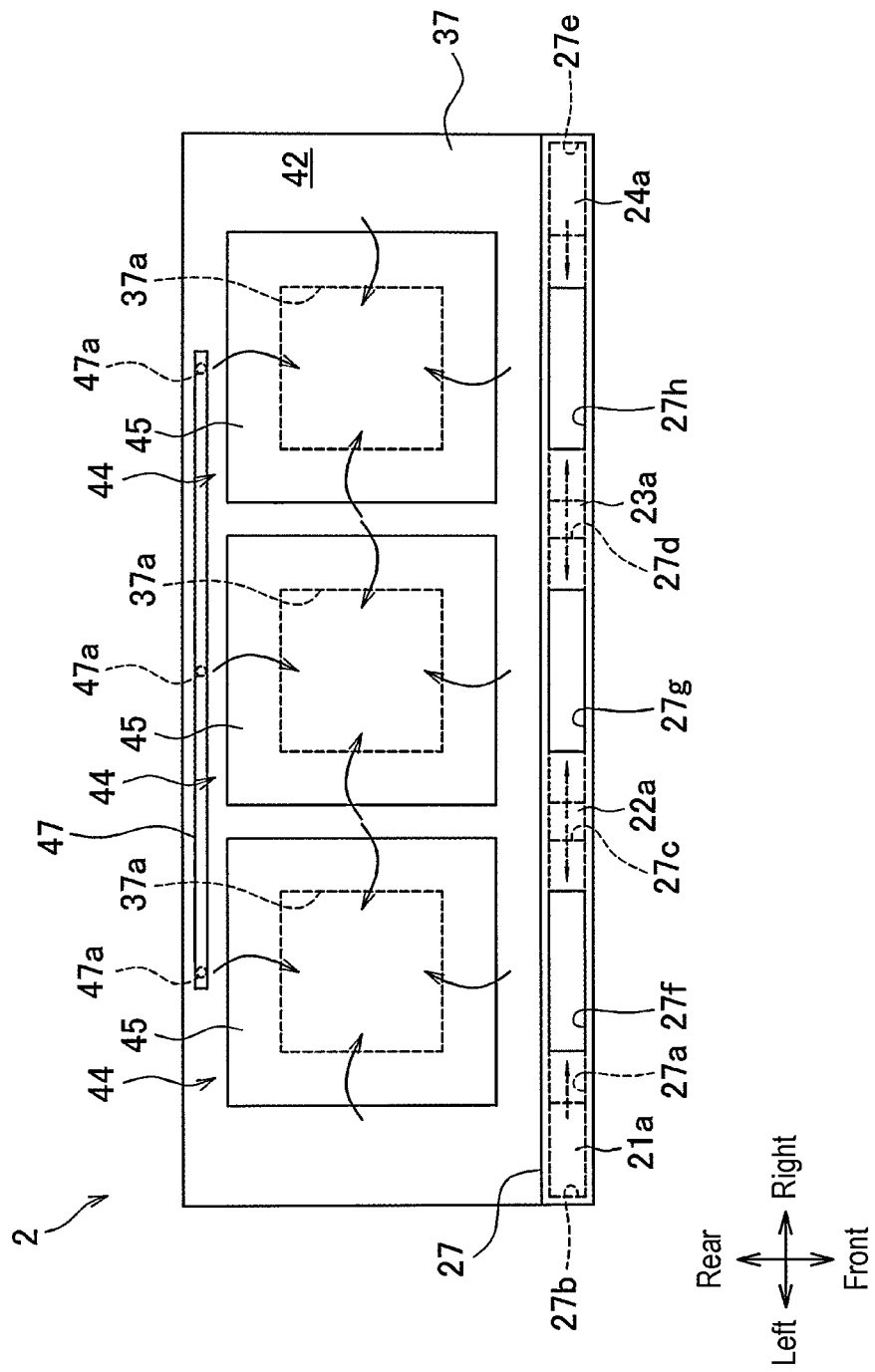
FIG. 6 is a sectional view taken along line VI-VI in FIG. 3.

Next, the housing 2 and the internal configuration thereof will be described with reference to FIGS. 3 to 6. FIG. 3 is a front view of the housing 2 as viewed from the front side. FIG. 4 is a sectional view taken along line IV-IV in FIG. 3. FIG. 5 is a sectional view taken along line V-V in FIG. 3. FIG. 6 is a sectional view taken along line VI-VI in FIG. 3. The partition walls are not shown in FIGS. 3 and 6. Furthermore, in FIG. 5, the transfer robot 3 and the like are omitted, and the load port 4 is indicated by a two-dot chain line.

The housing 2 has a substantially rectangular parallelepiped shape as a whole. As shown in FIGS. 3 to 5, the housing 2 includes columns 21 to 26, a connecting pipe 27, and partition walls 31 to 36. The partition walls 31 to 36 are attached to the columns 21 to 26 extending in the up-down direction. The internal space of the housing 2 is configured to be substantially sealed with respect to the external space.

More specifically, as shown in FIG. 4, at the front end portion of the housing 2, the columns 21 to 24 are sequentially arranged from the left side to the right side so as to be spaced apart from one another. Furthermore, the columns 21 to 24 are arranged upright so as to extend along the up-down direction. The columns 21 and 24 have substantially the same vertical length. The columns 22 and 23 also have substantially the same vertical length but are shorter than the column 21. On the left and right sides of the rear end portion of the housing 2, two columns 25 and 26 are arranged upright so as to extend along the up-down direction. The connecting pipe 27 extends in the left-right direction and connects the four columns 21 to 24 to one another. The connecting pipe 27 is connected to the upper ends of the columns 22 and 23 and is connected to the intermediate portions of the columns 21 and 24.

As shown in FIG. 3, the partition wall 31 is arranged at the bottom of the housing 2, and the partition wall 32 is arranged at the ceiling of the housing 2. As shown in FIG. 4, the partition wall 33 (side wall) is arranged at the front end, the partition wall 34 is arranged at the rear end, the partition wall 35 is arranged at the left end, and the partition wall 36 is arranged at the right end. The partition wall 33 has three openings (not shown). These three openings are arranged between the four columns 21 to 24 in the left-right direction and are closed by the bases 51 of the load ports 4. A mounting part 83 (see FIG. 3) on which an aligner 84 described later is mounted is provided at the right end of the housing 2. The aligner 84 and the mounting part 83 are also accommodated inside the housing 2 (see FIG. 4).

As shown in FIG. 5, a support plate 37 extending in the horizontal direction is arranged on the rear end side of the connecting pipe 27 at the upper portion of the housing 2. Thus, the inside of the housing 2 is divided into the above-described transfer chamber 41 formed on the lower side and an FFU installation chamber 42 formed on the upper side. Inside the FFU installation chamber 42, there are arranged three FFUs (fan filter units) 44 described later. At the center of the support plate 37 in the front-rear direction and at a position facing the FFU 44 in the up-down direction, there are formed three openings 37a that connect the transfer chamber 41 and the FFU installation chamber 42. These three openings 37a are arranged side by side along the left-right direction. Furthermore, the three openings 37a are arranged between the four columns 21 to 24 in the left-right direction as shown in FIG. 6. The openings 37a are gas delivery ports for delivering the supplied nitrogen (inert gas). The partition walls 33 to 36 of the housing 2 are divided into a lower wall for the transfer chamber 41 and an upper wall for the FFU installation chamber 42 (see, e.g., the partition walls 33a and 33b at the front end and the partition walls 34a and 34b at the rear end in FIG. 5).

Next, the internal configuration of the housing 2 will be described. Specifically, the configuration for circulating nitrogen in the housing 2 and the surrounding configuration thereof, and the devices and the like arranged in the transfer chamber 41 will be described.

The configuration for circulating nitrogen in the housing 2 and the surrounding configuration thereof will be described with reference to FIGS. 3 to 5. As shown in FIG. 5, a circulation path 40 for circulating nitrogen is formed inside the housing 2. The circulation path 40 is defined by the transfer chamber 41, the FFU installation chamber 42, and a return path 43 (gas return path). In the circulation path 40, clean nitrogen is sent downward from the FFU installation chamber 42 through each opening 37a. After reaching the lower end of the transfer chamber 41, nitrogen rises through the return path 43 and returns to the FFU installation chamber 42 (see arrows in FIG. 5). The details will be described below.

As shown in FIGS. 5 and 6, three FFUs 44 arranged on the support plate 37 and three chemical filters 45 arranged on the FFU 44 are provided in the FFU installation chamber 42. The FFU 44 includes a fan 44a and a filter 44b as shown in FIG. 5. The FFU 44 sends nitrogen in the FFU installation chamber 42 downward by a fan 44a and removes particles (not shown) contained in nitrogen by a filter 44b. The chemical filter 45 is designed to remove, for example, the active gas and the like brought into the circulation path 40 from the substrate processing apparatus 6. The nitrogen cleaned by the FFU 44 and the chemical filter 45 is sent from the FFU installation chamber 42 to the transfer chamber 41 through the openings 37a formed in the support plate 37. The nitrogen sent to the transfer chamber 41 forms a laminar flow and flows downward.

The return path 43 is formed in the columns 21 to 24 (the column 23 in FIG. 5) arranged at the front end of the housing 2 and the connecting pipe 27. The columns 21 to 24 and the connecting pipe 27 are hollow. Spaces 21a to 24a and 27a through which nitrogen can flow are formed in the columns 21 to 24 and the connecting pipe 27 (see FIG. 4). The spaces 21a to 24a of the columns 21 to 24 are formed to extend in the up-down direction. All the spaces 21a to 24a extend from the lower ends of the columns 21 to 24 to the position of the connecting pipe 27. The space 27a of the connecting pipe 27 extends in the left-right direction. In addition, as shown in FIGS. 5 and 6, communication ports 27b to 27e for bringing the spaces 21a to 24a of the columns 21 to 24 and the space 27a into communication with one another are formed on the lower surface of the connecting pipe 27. Furthermore, on the upper surface of the connecting pipe 27, there are formed three openings 27f to 27h opened toward the FFU installation chamber 42 (i.e., upward). These three openings 27f to 27h are arranged between the four columns 21 to 24 in the left-right direction and have a rectangular plan-view shape elongated in the left-right direction. In this way, the connecting pipe 27 is configured so that the nitrogen introduced from the four spaces 21a to 24a is first merged and then sent out to the FFU installation chamber 42 from the three openings 27f to 27h. Thus, the spaces 21a to 24a and 27a define the return path 43.

The return path 43 will be described more specifically with reference to FIG. 5. Although the column 23 is shown in FIG. 5, the same applies to other columns 21, 22, and 24. An introduction duct 28 for facilitating the flow of nitrogen in the transfer chamber 41 into the return path 43 (space 23a) is attached to the lower end of the column 23. An opening 28a is formed in the introduction duct 28 so that the nitrogen that has reached the lower end of the transfer chamber 41 can flow into the return path 43. That is, the opening 28a is a gas suction port that sucks the nitrogen in the transfer chamber 41 into the return path 43.

On the upper portion of the introduction duct 28, there is formed an enlarged portion 28b which spreads backward as it goes downward. A fan 46 is arranged in the introduction duct 28 below the enlarged portion 28b. The fan 46 is driven by a motor (not shown). The fan 46 sucks the nitrogen that has reached the lower end of the transfer chamber 41 into the return path 43 (the space 23a in FIG. 5) and sends the nitrogen upward to return the nitrogen to the FFU installation chamber 42. The nitrogen returned to the FFU installation chamber 42 is sucked from the upper surface of the chemical filter 45 to the side of the FFU 44, cleaned by the FFU 44 and the chemical filter 45, and sent again to the transfer chamber 41 through the opening 37a. As described above, the nitrogen can be circulated in the circulation path 40.

Further, as shown in FIG. 3, a supply pipe 47 for supplying nitrogen into the FFU installation chamber 42 (circulation path 40) is arranged above the rear end of the FFU installation chamber 42. The supply pipe 47 is connected to an external pipe 48 connected to a nitrogen supply source 111. A supply valve 112 capable of changing the supply amount of nitrogen per unit time is provided in the middle of the external pipe 48. The supply pipe 47, the external pipe 48, the supply valve 112, and the supply source 111 constitute an inert gas supply unit. When an inert gas supply line is installed in a factory or the like, the supply line and the supply pipe 47 may be connected. Therefore, the inert gas supply unit may be composed of only the supply pipe 47.

As shown in FIGS. 3 and 6, the supply pipe 47 extends in the left-right direction and has three discharge ports 47a. The three discharge ports 47a are arranged along the left-right direction so as to be spaced apart from one another and are configured to discharge nitrogen from the supply pipe 47 into the FFU installation chamber 42. As shown in FIG. 5, these three discharge ports 47a are configured to discharge nitrogen downward. The three discharge ports 47a are arranged at the same position as the center of the FFC 44 in the left-right direction.

Further, as shown in FIG. 5, a discharge pipe 49 for discharging the gas in the circulation path 40 is connected to the lower end of the load port 4. In the load port 4, an accommodation chamber 60 in which the door driving mechanism 55 is accommodated as described later is in communication with the transfer chamber 41 via a slit 51b formed in the base 51 (see FIG. 7). The discharge pipe 49 is connected to the accommodation chamber 60. The discharge pipe 49 is connected to, for example, an exhaust port (not shown). A discharge valve 113 that can change the discharge amount of the gas in the circulation path 40 per unit time is provided in the middle of the discharge pipe 49. The discharge pipe 49 and the discharge valve 113 constitute a gas discharge unit.

The supply valve 112 and the discharge valve 113 are electrically connected to the controller 5 (see FIG. 2). As a result, nitrogen can be appropriately supplied to and discharged from the circulation path 40. For example, when the EFEM 1 is started (for example, when the EFEM 1 is started after maintenance), if the oxygen concentration in the circulation path 40 is increasing, nitrogen is supplied from the supply source 111 to the circulation path 40 via the external pipe 48 and the supply pipe 47, and the gas (including nitrogen and oxygen) in the circulation path 40 and the accommodation chamber 60 is discharged via the discharge pipe 49 (specifically, the gas in the circulation path 40 is discharged via the slit 51d, the accommodation chamber 60, and the discharge pipe 49), whereby the oxygen concentration can be lowered. That is, the atmosphere in the circulation path 40 and the accommodation chamber 60 can be replaced with a nitrogen atmosphere. Even when the oxygen concentration in the circulation path 40 rises while the EFEM 1 is operating, the oxygen concentration can be lowered by temporarily supplying a large amount of nitrogen to the circulation path 40 and discharging oxygen together with nitrogen through the discharge pipe 49. Moreover, in the EFEM 1 of the type in which nitrogen is circulated, the pressure in the circulation path 40 needs to be kept slightly higher than the external pressure in order to reliably suppress the invasion of the ambient air from the outside into the circulation path 40 while suppressing the leakage of nitrogen from the circulation path 40 to the outside. Specifically, the pressure in the circulation path 40 may be in the range of 1 Pa(G) to 3000 Pa(G), preferably 3 Pa(G) to 500 Pa(G), and more preferably 5 Pa(G) to 100 Pa(G). Therefore, when the pressure in the circulation path 40 is out of a predetermined range, the controller 5 changes the discharge flow rate of nitrogen by changing the opening degree of the discharge valve 113 so that the pressure becomes a predetermined target pressure. In this way, the supply flow rate of nitrogen is adjusted based on the oxygen concentration, and the discharge flow rate of nitrogen is adjusted based on the pressure, whereby the oxygen concentration and the pressure can be controlled. In the present embodiment, the pressure is adjusted so as to obtain a pressure difference of 10 Pa(G).

Next, the devices and the like arranged in the transfer chamber 41 will be described with reference to FIGS. 3 and 4. As shown in FIGS. 3 and 4, the aforementioned transfer robot 3, a controller storage box 81, a measurement instrument storage box 82, and an aligner 84 are arranged in the transfer chamber 41. The controller storage box 81 is installed, for example, on the left side of the base part 90 (see FIG. 3) of the transfer robot 3 and is arranged so as not to interfere with the arm mechanism 70 (see FIG. 3). The controller storage box 81 accommodates the robot controller 11 and the load port controller 12 described above. The measurement instrument storage box 82 is installed, for example, on the right side of the base part 90, and is arranged so as not to interfere with the arm mechanism 70. The measurement instrument storage box 82 can accommodate measurement instruments (see FIG. 2) such as the oxygen concentration meter 85, the pressure gauge 86, and the hygrometer 87 described above.

The aligner 84 is used to detect how much the holding position of the wafer W held by the arm mechanism 70 (see FIG. 3) of the transfer robot 3 deviates from a target holding position. For example, the wafer W may be slightly moved inside the FOUP 100 (see FIG. 1) transferred by the OHT (not shown) described above. Therefore, the transfer robot 3 once places the unprocessed wafer W, which is taken out of the FOUP 100, on the aligner 84. The aligner 84 measures how far the wafer W is held by the transfer robot 3 from the target holding position and sends the measurement result to the robot controller 11. The robot controller 11 corrects the holding position in the arm mechanism 70 based on the above measurement result, controls the arm mechanism 70 to hold the wafer W at the target holding position, and causes the arm mechanism 70 to transfer the wafer W to the load lock chamber 6*a* of the substrate processing apparatus 6. As a result, the wafer W can be normally processed by the substrate processing apparatus 6.

(Configuration of Load Port)

Next, the configuration of the load port will be described below with reference to FIGS. 7 and 8. FIG. 7 is a side sectional view of the load port showing a state in which the door is closed. FIG. 8 is a side sectional view of the load port showing a state in which the door is opened. FIGS. 7 and 8 are depicted in a state in which an external cover 4*b* (see FIG. 5) located below the mounting table 53 is removed.

As shown in FIG. 7, the load port 4 includes a plate-shaped base 51 installed upright in the up-down direction and a horizontal base portion 52 formed to protrude forward from the central portion of the base 51 in the up-down direction. A mounting table 53 (mounting part) for mounting the FOUP 100 is provided above the horizontal base portion 52. The mounting table 53 can be moved in the front-rear direction by a mounting table driving part (not shown) in a state in which the FOUP 100 is mounted on the mounting table 53.

The base 51 constitutes a part of the partition wall 33 that separates the transfer chamber 41 from the external space. The base 51 has a substantially rectangular plan-view shape elongated in the up-down direction. Furthermore, the base 51 includes a window 51*a* formed at a position where the base 51 can face the mounted FOUP 100 in the front-rear direction. Moreover, the base 51 includes a slit 51*b* extending in the up-down direction so that a support frame 56 described later can move along the slit 51*b*. The slit 51*b* is formed at a position below the horizontal base portion 52 in the up-down direction. The slit 51*b* is formed only in a range in which the support frame 56 can move up and down while penetrating the base 51. The slit 51*b* has a small opening width in the left-right direction. Therefore, particles in the accommodation chamber 60 are less likely to enter the transfer chamber 41 via the slit 51*b*.

The load port 4 includes an opening/closing mechanism 54 capable of opening and closing the lid 101 of the FOUP 100. The opening/closing mechanism 54 includes a door 4*a* capable of closing the window 51*a*, and a door driving mechanism 55 for driving the door 4*a*. The door 4*a* is configured to be able to close the window 51*a*. The door 4*a* is configured to be able to unlock the lid 101 of the FOUP 100 and hold the lid 101. The door driving mechanism 55 includes a support frame 56 for supporting the door 4*a*, a movable block 58 for supporting the support frame 56 via a slide support unit 57 so as to be movable in the front-rear direction, and a slide rail 59 for supporting the movable block 58 so as to be movable in the up-down direction with respect to the base 51.

The support frame 56 supports the lower rear portion of the door 4*a*. The support frame 56 is a substantially crank-shaped and plate-shaped member that extends downward, passes through the slit 51*b* provided in the base 51, and protrudes toward the front side of the base 51. The slide support unit 57, the movable block 58, and the slide rail 59 for supporting the support frame 56 are provided in front of the base 51. That is, a driving part for moving the door 4*a* is accommodated in the accommodation chamber 60 provided outside the housing 2 and below the horizontal base portion 52. The accommodation chamber 60 is surrounded by the horizontal base portion 52, the substantially box-shaped cover 61 extending downward from the horizontal base portion 52, and the base 51, and is kept in a substantially sealed state.

The above-mentioned discharge pipe 49 is connected to the bottom wall 61*a* of the cover 61. That is, the accommodation chamber 60 and the discharge pipe 49 are connected. In the present embodiment, the accommodation chamber 60 and the discharge pipe 49 are connected to each of the three load ports 4. As a result, the gas in the circulation path 40 can be discharged from the discharge pipe 49 via the accommodation chamber 60 of each load port 4. Therefore, when the gas is discharged from the discharge pipe 49, the particles existing in each accommodation chamber 60 can be discharged together with the gas. Furthermore, a fan 62 facing the discharge pipe 49 is provided on the bottom wall 61*a* inside the accommodation chamber 60. Since the fan 62 is provided in the accommodation chamber 60 in this manner, it is possible to easily discharge the gas from the accommodation chamber 60 to the discharge pipe 49 while suppressing the particles from flying up. If there is provided a fan that sends the gas in the transfer chamber 41 toward the accommodation chamber 60, the airflow in the transfer chamber 41 is likely to be disturbed, and the particles in the transfer chamber 41 are likely to fly up. However, in the present embodiment, the fan 62 is arranged in the accommodation chamber 60. Therefore, it is possible to suppress the particles in the transfer chamber 41 from flying up. In addition, in the present embodiment, there is adopted a configuration in which the connection location of the gas discharge unit (discharge pipe 49) (the installation location of the fan 62) is provided on the bottom wall 61*a* of the bottom surface of the accommodation chamber 60 so as to be spaced apart from the communication location provided by the slit 51*b*.

Subsequently, the opening/closing operation of the lid 101 of the FOUP 100 and the door 4*a* will be described below.

First, as shown in FIG. 7, the mounting table 53 and the FOUP 100 mounted on the mounting table 53 are moved rearward in a state in which the FOUP 100 is separated from the base 51, whereby the lid 101 and the door 4a are brought into contact with each other. At this time, the door 4a of the opening/closing mechanism 54 unlocks the lid 101 of the FOUP 100 and holds the lid 101.

Next, as shown in FIG. 8, the support frame 56 is moved rearward. As a result, the door 4a and the lid 101 are moved rearward. By doing so, the lid 101 of the FOUP 100 is opened and the door 4a is opened, whereby the transfer chamber 41 of the housing 2 and the FOUP 100 are brought into communication with each other.

Next, as shown in FIG. 8, the support frame 56 is moved downward. As a result, the door 4a and the lid 101 are moved downward. By doing so, the FOUP 100 is largely opened as a loading/unloading port, and the wafer W can be moved between the FOUP 100 and the EFEM 1. When closing the lid 101 and the door 4a, the operation reverse to the above-described one may be performed. The series of operations of the load port 4 is controlled by the load port controller 12.

As described above, according to the EFEM 1 of the present embodiment, the discharge pipe 49 that constitutes the gas discharge unit is connected to the accommodation chamber 60 of the load port 4 in which a part of the opening/closing mechanism 54 is accommodated. As a result, when the atmosphere in the circulation path 40 is replaced with the nitrogen atmosphere, the atmosphere in the accommodation chamber 60 can be quickly replaced with the nitrogen atmosphere. For example, when starting the EFEM 1 (after performing maintenance), nitrogen is supplied from the supply pipe 47 (inert gas supply unit) and the gas is discharged by the discharge pipe 49 (gas discharge unit), which makes it easy to quickly replace the atmosphere in the transfer chamber 41 and the accommodation chamber 60 with the nitrogen atmosphere. Therefore, it is possible to shorten the time required until the work such as the transfer of the wafer W (substrate) or the like is started. Furthermore, particles in the accommodation chamber 60 can also be discharged when discharging the gas, whereby the particles in the accommodation chamber 60 are less likely to fly up during the operation of the opening/closing mechanism 54, and the particles are less likely to enter into the transfer chamber 41.

Furthermore, the EFEM 1 includes the openings 37a (gas outlets) provided in the upper portion of the transfer chamber 41 to send out nitrogen, the opening 28a (gas suction port) provided in the lower portion of the transfer chamber 41 to suck nitrogen, and the return path 43 (gas return path) configured to return the nitrogen from the opening 28a to the opening 37a. The filter 44b is provided between the fan 44a and the opening 37a (gas outlet). Therefore, it is possible to circulate nitrogen through the return path 43 while generating a descending air flow of nitrogen from which particles have been removed in the transfer chamber 41. Therefore, it becomes possible to suppress the consumption of nitrogen and reduce the cost.

Furthermore, the discharge pipe 49 is connected to the bottom wall 61a. As a result, it is possible to effectively discharge the particles in the accommodation chamber 60, which stay on the lower side.

Furthermore, the discharge pipe 49 is connected to the load port 4 arranged in front of the housing 2. Therefore, the degree of freedom of the piping layout of the discharge pipe 49 is improved. For example, when the discharge pipe is connected to the rear end of the housing 2, there is a risk of buffering with the substrate processing apparatus 6. When the discharge pipe 49 is connected to the left end or the right end of the housing 2, the installation area in the left-right direction of the EFEM 1 itself becomes large, which tends to restrict the piping layout.

Although the preferred embodiment of the present disclosure has been described above, the present disclosure is not limited to the above-described embodiment. Various modifications may be made as long as they are recited in the claims. Although the fan 62 is provided in the above-described embodiment, the suction unit (e.g., the vacuum in a factory or the like) and the discharge pipe 49 may be connected without providing the fan 62. Furthermore, the discharge pipe 49 may be connected to a portion other than the bottom wall 61a as long as it is connected to the accommodation chamber 60.

Furthermore, in the present embodiment, the amount of gas discharged from the accommodation chamber 60 is adjusted by controlling the opening degree of the discharge valve 113 while keeping the rotation speed of the fan 62 constant. Alternatively, the amount of gas discharged from the accommodation chamber 60 may be adjusted by controlling the rotation speed of the fan 62.

Furthermore, the return path 43 may not be provided in the housing 2. That is, nitrogen (inert gas) may not be circulated. Although the spaces 21a to 24a and 27a formed inside the columns 21 to 24 and the connecting pipe 27 serve as the return path 43, the present disclosure is not limited thereto. That is, the return path 43 may be defined by other members.

Furthermore, a gas discharge unit may be provided in the return path in addition to the above-described gas discharge unit.

Further, in the present embodiment, there has been described the configuration in which the article to be transferred is a semiconductor substrate and the inert gas is supplied to the EFEM 1 provided with the load port 4 including the accommodation chamber 60. However, the present disclosure is not limited thereto. For example, the article to be transferred may be a medicine, a specimen, a cell, or the like, and the gas to be supplied may be a decontamination gas (e.g., a $H_2O_2$ gas) for performing sterilization (decontamination) or a gas having a controlled carbon dioxide concentration.

A transfer system may include: a container opening/closing device having an opening/closing mechanism for opening and closing a lid of a container in which a transfer target article is accommodated; a housing provided adjacent to the container opening/closing device and configured to define therein a transfer chamber for transferring the transfer target article; a gas supply unit configured to supply a predetermined gas into the transfer chamber; and a gas discharge unit configured to discharge the gas in the transfer chamber, wherein the container opening/closing device includes an accommodation chamber configured to accommodate a part of the opening/closing mechanism and kept in communication with the transfer chamber, and the gas discharge unit is connected to the accommodation chamber so as to discharge the gas in the transfer chamber via the accommodation chamber.

EXPLANATION OF REFERENCE NUMERALS

1: EFEM, 2: housing, 3: transfer robot (substrate transfer device), 4: load port, 28a: opening (gas suction port), 33: partition wall (side wall), 37a: opening (gas outlet), 41: transfer chamber, 43: return path (gas return path), 44b:

filter, 47: supply pipe (inert gas supply unit), 49: discharge pipe (gas discharge unit), 53: mounting table (mounting part), 54: opening/closing mechanism, 60: accommodation chamber, 61*a*: bottom wall, 62: fan, 100: FOUP, 101: lid (lid portion), W: wafer (substrate)

What is claimed is:

1. An equipment front end module (EFEM) comprising:
a transfer chamber in which a substrate is transferred;
a unit installation chamber in which a fan filter unit configured to send an inert gas to the transfer chamber is installed;
at least one return path that is configured to return the inert gas flowing in the transfer chamber to the unit installation chamber and is arranged in a front end portion of the transfer chamber;
a load port that is configured to mount a container accommodating the substrate and is connected to the front end portion of the transfer chamber at a front side of a predetermined front-rear direction;
an introduction duct having an opening portion and attached to the return path; and
a discharge pipe for discharging gas in the transfer chamber,
wherein the at least one return path comprises a plurality of return paths, and
wherein cross-sectional areas of return paths, among the plurality of return paths, which are disposed at both ends of the transfer chamber in a left-right direction orthogonal to the front-rear direction are larger than a cross-sectional area of a return path, among the plurality of return paths, other than the return paths disposed at both the ends of the transfer chamber in the left-right direction.

2. The equipment front end module of claim 1, wherein the discharge pipe is disposed below the opening portion of the introduction duct.

3. The equipment front end module of claim 1, wherein the opening portion of the introduction duct is configured to face downward, and
a cross-sectional area of the opening portion of the introduction duct is larger than a cross-sectional area of the return path.

4. The equipment front end module of claim 1, wherein lengths of return paths, among the plurality of return paths, which are disposed at both ends of the transfer chamber in a left-right direction orthogonal to the front-rear direction are larger than a length of a return path, among the plurality of return paths, other than the return paths disposed at both the ends of the transfer chamber in the left-right direction.

5. The equipment front end module of claim 1, wherein the introduction duct has an enlarged portion, and
a fan for the return path is installed in the enlarged portion.

6. The equipment front end module of claim 5, wherein a cross-sectional area of the enlarged portion is larger than a cross-sectional area of the return path.

7. The equipment front end module of claim 1, further comprising a transfer robot arranged in the transfer chamber and configured to deliver the substrate between the container and the substrate processing apparatus,
wherein the transfer robot is arranged adjacent to a rear end portion of the transfer chamber opposite to the front end portion of the transfer chamber.

8. The equipment front end module of claim 2, wherein the opening portion of the introduction duct is configured to face downward, and
a cross-sectional area of the opening portion of the introduction duct is larger than a cross-sectional area of the return path.

9. The equipment front end module of claim 2, wherein lengths of return paths, among the plurality of return paths, which are disposed at both ends of the transfer chamber in a left-right direction orthogonal to the front-rear direction are larger than a length of a return path, among the plurality of return paths, other than the return paths disposed at both the ends of the transfer chamber in the left-right direction.

10. The equipment front end module of claim 2, wherein the introduction duct has an enlarged portion, and
a fan for the return path is installed in the enlarged portion.

11. The equipment front end module of claim 10, wherein a cross-sectional area of the enlarged portion is larger than a cross-sectional area of the return path.

12. The equipment front end module of claim 2, further comprising a transfer robot arranged in the transfer chamber and configured to deliver the substrate between the container and the substrate processing apparatus,
wherein the transfer robot is arranged adjacent to a rear end portion of the transfer chamber opposite to the front end portion of the transfer chamber.

* * * * *